US012656815B2

(12) United States Patent
Wen

(10) Patent No.: US 12,656,815 B2
(45) Date of Patent: Jun. 16, 2026

(54) NOTEBOOK COMPUTER AND POWER CONTROL METHOD

(71) Applicant: Shengmin Wen, Phoenix, AZ (US)

(72) Inventor: Shengmin Wen, Phoenix, AZ (US)

( * ) Notice: Subject to any disclaimer, the term of this patent is extended or adjusted under 35 U.S.C. 154(b) by 0 days.

(21) Appl. No.: 18/807,615

(22) Filed: Aug. 16, 2024

(65) Prior Publication Data

US 2024/0411343 A1     Dec. 12, 2024

Related U.S. Application Data

(63) Continuation of application No. PCT/US2023/067275, filed on May 21, 2023.

(51) Int. Cl.
G06F 1/16          (2006.01)
H05K 5/03          (2006.01)

(52) U.S. Cl.
CPC .......... G06F 1/1618 (2013.01); G06F 1/1683 (2013.01); H05K 5/03 (2013.01)

(58) Field of Classification Search
CPC ............................ G06F 1/1656; G06F 1/1692
USPC ........................................ 200/341, 344, 345
See application file for complete search history.

(56) References Cited

U.S. PATENT DOCUMENTS

| | | | | | |
|---|---|---|---|---|---|
| 771,547 A | * | 10/1904 | Harmon | ................. | H01H 37/76 |
| | | | | | 200/341 |
| 1,143,264 A | * | 6/1915 | Franck | .................. | H01H 13/02 |
| | | | | | 200/530 |
| 1,750,469 A | * | 3/1930 | Hayes | .................... | H01H 13/10 |
| | | | | | 200/345 |
| 1,967,030 A | * | 7/1934 | Kull | ...................... | B60Q 5/003 |
| | | | | | 200/345 |
| 2,454,342 A | * | 11/1948 | Ross | .................... | H01H 13/183 |
| | | | | | 200/531 |
| 2,572,335 A | * | 10/1951 | Hafke | .................... | H01H 13/20 |
| | | | | | 200/345 |
| 2,841,031 A | * | 7/1958 | Young | .................... | H03J 1/063 |
| | | | | | 74/504 |
| 2,883,496 A | * | 4/1959 | White | ................... | G08B 5/221 |
| | | | | | 200/309 |
| 3,047,700 A | * | 7/1962 | Bailey | ................... | H01H 13/14 |
| | | | | | 16/DIG. 30 |
| 3,895,205 A | * | 7/1975 | Tharp | ................. | H01H 71/128 |
| | | | | | 200/341 |
| 5,243,549 A | * | 9/1993 | Oshiba | .................. | G06F 1/1616 |
| | | | | | 361/679.55 |
| 5,335,192 A | * | 8/1994 | Oshiba | .................. | G06F 1/1616 |
| | | | | | 361/679.09 |

(Continued)

FOREIGN PATENT DOCUMENTS

| | | | | |
|---|---|---|---|---|
| CN | 203259932 | * | 10/2013 | ........... G06F 1/1632 |

OTHER PUBLICATIONS

International Search Report and Written Opinion of the International Searching Authority in International Application No. PCT/US2023/067275.

*Primary Examiner* — Adrian S Wilson
(74) *Attorney, Agent, or Firm* — Amsel IP Law PLLC; Jason Amsel

(57)          ABSTRACT

A notebook computer is disclosed. The notebook computer comprises a lid module, a main body base, and a power switch module. The power switch module is disposed in such a way that the user can access it when the notebook computer is in a closed position.

15 Claims, 10 Drawing Sheets

<u>1</u>

152

30

(56) References Cited

U.S. PATENT DOCUMENTS

| | | | | | |
|---|---|---|---|---|---|
| 5,410,497 | A | * | 4/1995 | Viletto | G06F 1/1656 708/174 |
| 5,852,670 | A | * | 12/1998 | Setlak | G06V 40/1347 382/126 |
| 5,914,853 | A | * | 6/1999 | Motoe | G06F 1/1679 345/905 |
| 5,938,772 | A | | 8/1999 | Welch | |
| 6,122,162 | A | | 9/2000 | Horie et al. | |
| 7,013,570 | B2 | * | 3/2006 | Levine | G01V 3/15 324/67 |
| 7,271,997 | B2 | * | 9/2007 | Kee | G06F 1/1692 345/169 |
| 7,884,299 | B2 | * | 2/2011 | Glew | H03K 17/962 200/600 |
| 8,624,844 | B2 | * | 1/2014 | Behar | G06F 1/1601 345/184 |
| 9,142,367 | B2 | * | 9/2015 | Dai | H01H 13/52 |
| 9,785,821 | B2 | * | 10/2017 | Wen | G06V 40/1306 |
| 11,625,945 | B2 | * | 4/2023 | Tan | G06V 40/1306 382/124 |
| 2004/0061999 | A1 | * | 4/2004 | Takemoto | G06F 1/162 248/917 |
| 2005/0044428 | A1 | | 2/2005 | Olson | |
| 2005/0076088 | A1 | * | 4/2005 | Kee | G06F 1/169 709/206 |
| 2005/0117286 | A1 | | 6/2005 | Karashima et al. | |
| 2005/0237702 | A1 | * | 10/2005 | Kee | G06F 1/1616 361/679.09 |
| 2006/0197861 | A1 | * | 9/2006 | Won | H04M 1/022 348/333.06 |
| 2008/0202912 | A1 | * | 8/2008 | Boddie | H03K 17/962 200/600 |
| 2009/0154085 | A1 | * | 6/2009 | Goto | G06F 1/1635 361/679.01 |
| 2009/0267866 | A1 | * | 10/2009 | Reddy | G06F 3/1431 345/1.1 |
| 2010/0102830 | A1 | * | 4/2010 | Curtis | G06F 3/0447 200/600 |
| 2011/0065081 | A1 | * | 3/2011 | Wen | G09B 5/02 434/322 |
| 2011/0272260 | A1 | * | 11/2011 | Wallace | H03K 17/975 200/300 |
| 2013/0141854 | A1 | | 6/2013 | Behar et al. | |
| 2014/0014481 | A1 | * | 1/2014 | Dai | H01H 13/52 200/247 |
| 2016/0202727 | A1 | | 7/2016 | Lin et al. | |
| 2017/0061187 | A1 | * | 3/2017 | Wen | G06V 40/1306 |
| 2017/0147087 | A1 | * | 5/2017 | Pance | G06F 3/0238 |
| 2017/0177113 | A1 | * | 6/2017 | Shen | G06F 3/0446 |
| 2019/0172457 | A1 | | 6/2019 | Cheng et al. | |
| 2019/0196605 | A1 | * | 6/2019 | Pance | G06F 1/1684 |
| 2021/0397809 | A1 | * | 12/2021 | Tan | G06V 40/1329 |
| 2023/0247126 | A1 | * | 8/2023 | Lee | G06F 1/1671 455/575.1 |

* cited by examiner

Power Switch

Power Switch

Notebook Connection

Notebook
Computer

Power Switch

1

15

151

152

13

13

16

161        162

1

152

30

<u>1</u>

152

30

15

16

<u>1</u>

13

13

30

15

16

I – I

1

1

<u>1</u>

NOTEBOOK COMPUTER AND POWER CONTROL METHOD

CROSS-REFERENCE TO RELATED APPLICATIONS

The application is a continuation of International Application No. PCT/US2023/067275 filed on May 21, 2023, which is incorporated by reference herein.

BACKGROUND OF THE INVENTION

The invention relates in general to a computer, and more particularly to a notebook computer.

DESCRIPTION OF THE RELATED ART

Notebook computers are used by millions or even billions in the daily lives of consumers as well as professionals because they are extremely affordable and yet powerful enough to handle almost every task, even those that previously only a powerful desktop computer could handle. Improving user experience has become an important goal of technology innovations for notebook computers.

In general, a notebook computer comprises a main body base, a power switch, and a display screen assembled on a lid module which is attached to the back side of the main body base to be rotatable between an opened position and a closed position. In the developmental history of the notebook computer, the functions of the power switch have been enhanced, but its location has always been mostly on the top surface of the main body base. The lid module of a notebook computer must be lifted to an open position before the user can access the power switch, turning the notebook computer on, off, or into a hibernation state.

The notebook computer's use circumstances have expanded substantially. A lot of times a notebook connects multiple peripheral devices, such as a mouse, keyboard, and several large size high quality external displays to achieve optimum user experience. In such situations the notebook computer in a closed position is preferred for better user experience. It also saves the notebook's battery usage, extends the display screen's lifetime, and takes less working space. In such circumstances, it is desirable to have access to the power switch when the notebook computer is in a closed position.

SUMMARY OF THE INVENTION

To provide the aforementioned user experience, the primary object of the invention is to design a compound power supply switch for notebook computers to power on, power off, and to turn into hibernation state when the notebook computer is in a closed position. To achieve the foregoing object, the power switch module for notebook computers according to the invention mainly includes a power switch module that is disposed on the external cover of the notebook computer such that the user interface of the said power switch is accessible when the notebook computer is in a closed position. One embodiment has the power switch module disposed on the back cover of the lid module. Another embodiment has the power switch module disposed on the back cover of the main body base. The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1A:
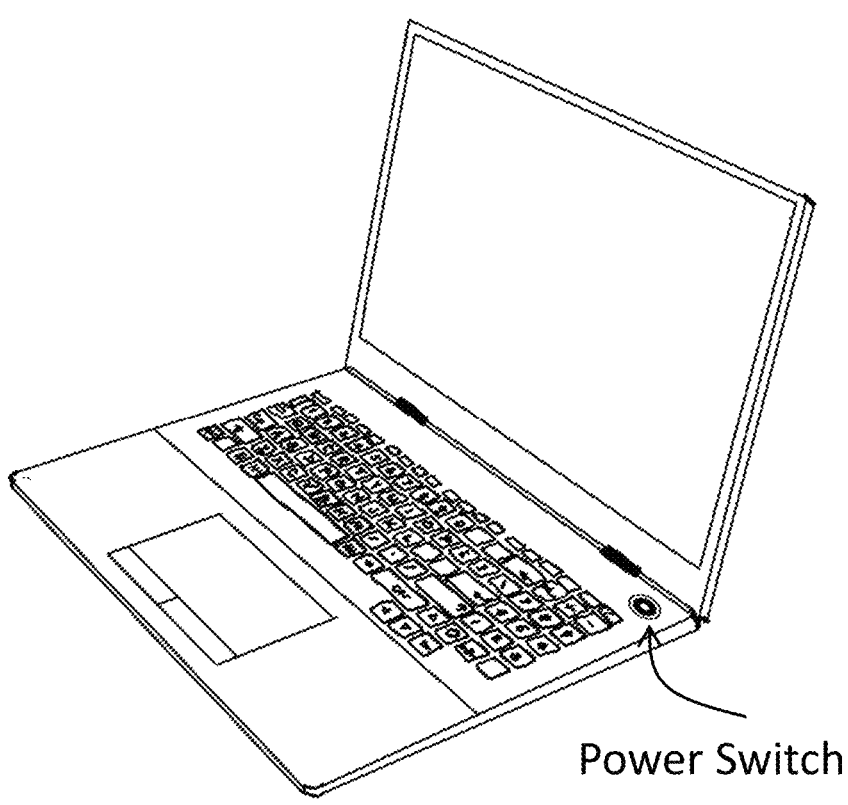
FIGS. 1A through 1D show an appearance view of notebook computer system of prior art.
Figure 1B:
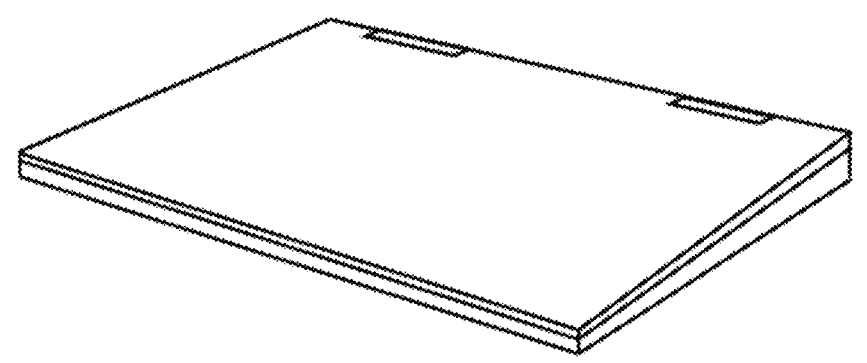
Figure 1C:
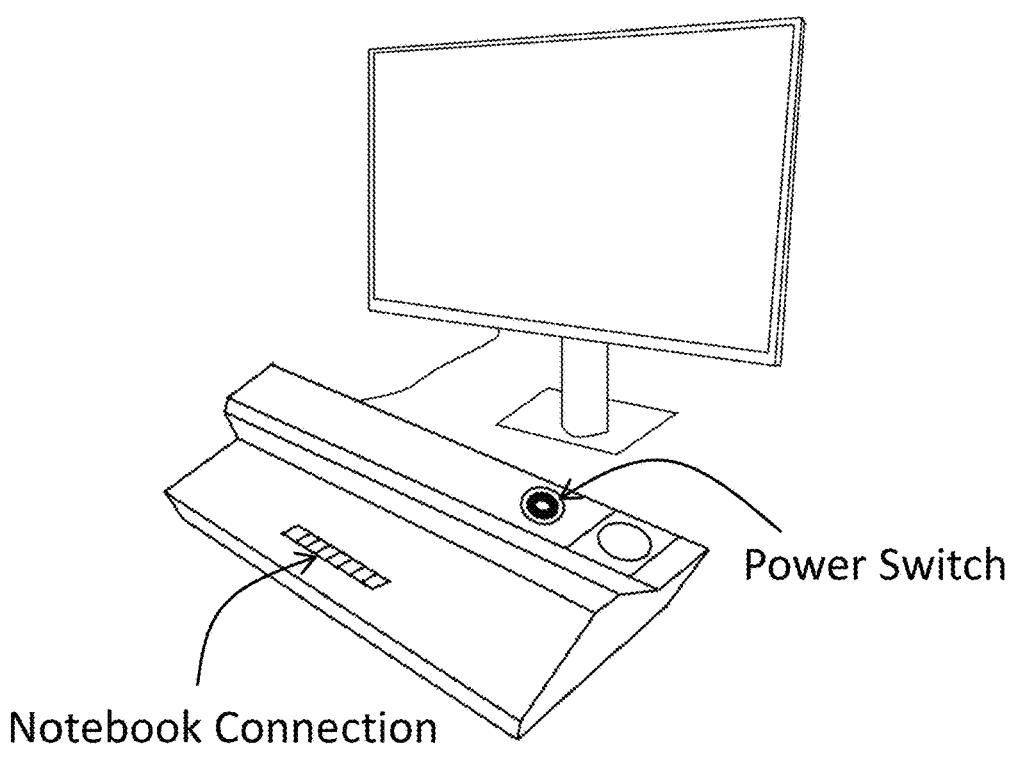
Figure 1D:
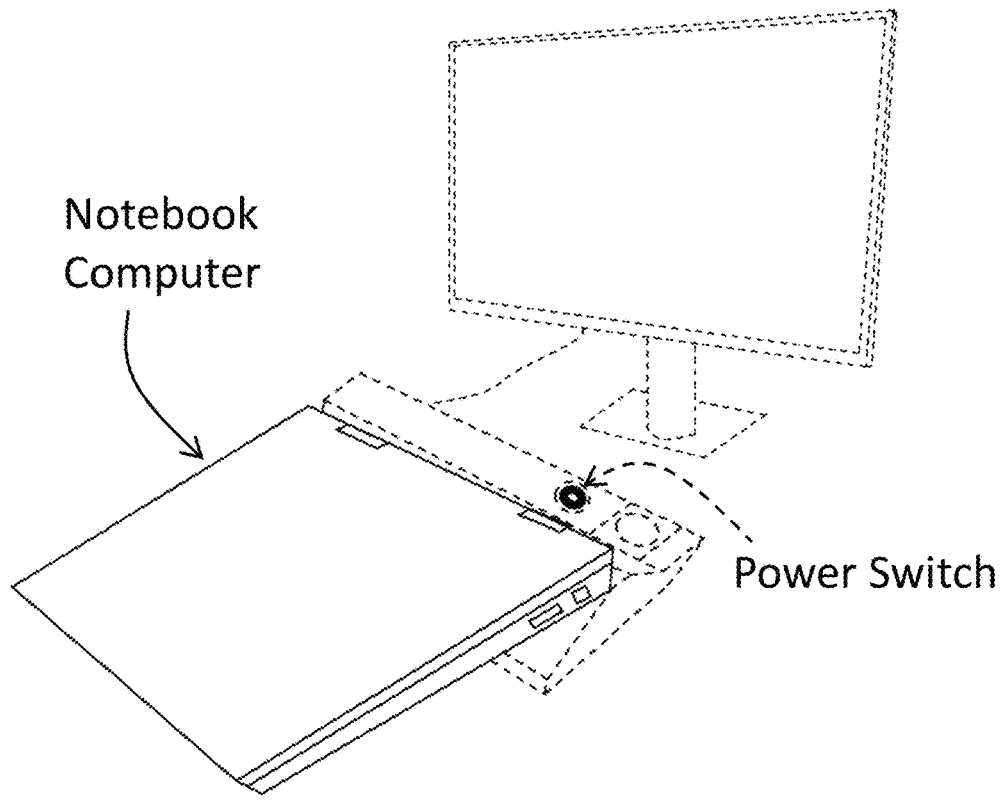

To better understand the invention, here is a brief review of the prior art. FIG. 1A shows an appearance view of the prior art of a notebook computer in an opened use position. The power switch module is disposed on the main body base at the rear portion in the vicinity of the hinge that is for pivotal movement relative thereto between the lid module and main body base. The power switch can only be operated when the notebook computer is in this opened use position. FIG. 1B shows the prior art of a notebook computer in a closed position, and the power switch module is not accessible. FIG. 1C shows an appearance view of a combination of docking station and display system that has been designed to use together with a notebook computer. In this setting there is a power switch module disposed on the docking station. User can use this power switch to control the power state of the notebook computer without the need to open the notebook computer. FIG. 1D shows an appearance view of the arrangement when a notebook computer uses the docking station and a connected peripheral display combination. This invention is to achieve an accessible power switch when the notebook computer is in a closed position without the presence of a combination of docking station and display system.

First Embodiment

FIGS. 2A-D show appearance views of notebook computer according to a first embodiment. The notebook computer 1 comprises a lid module 15 and a main body base 16. Lid module 15 and main body base 16 are connected by a connecting part 13. In one implementation, connecting part 13 is a hinge part. In another implementation, connecting part 13 is a magnetic connecting part, where lid module 15 and control unit 16 may be connected by using the attractive force generated by a pair of magnets located in the lid module 15 and in main body base 16, respectively.

The lid module 15 comprises at a minimum a display screen 151 facing toward the first face 161 of main body base 16, and a solid lid back cover 152 that is opposite to the display screen 151. When the notebook is closed, the lid back cover 152 will then become a part for the protection of the main body base 16 and display screen 151. Display screen 151 may be a Liquid Crystal Display (LCD). Display screen 151 may also be an organic light-emitting diode (OLED or organic LED). Display screen 151 may also be an e-paper type of display. Lid module 15 with display screen 151 may take a solid form factor. Lid module 15 with display screen may also take a bendable form factor.

The main body base 16 houses the components and circuitry of the computing devices (e.g., keyboard, touch pad, a microprocessor, Read-Only Memory (ROM), Random-Access Memory (RAM), a disk drive, a battery, and various input/output (I/O) support circuitry). It comprises at least a first surface 161, where keyboard, touch pad, and other auxiliary control buttons and functional keys are usually assembled, and a second surface 162 that is opposite to the first surface 161, with other components being installed and placed in between these two surfaces.

Figure 2A:
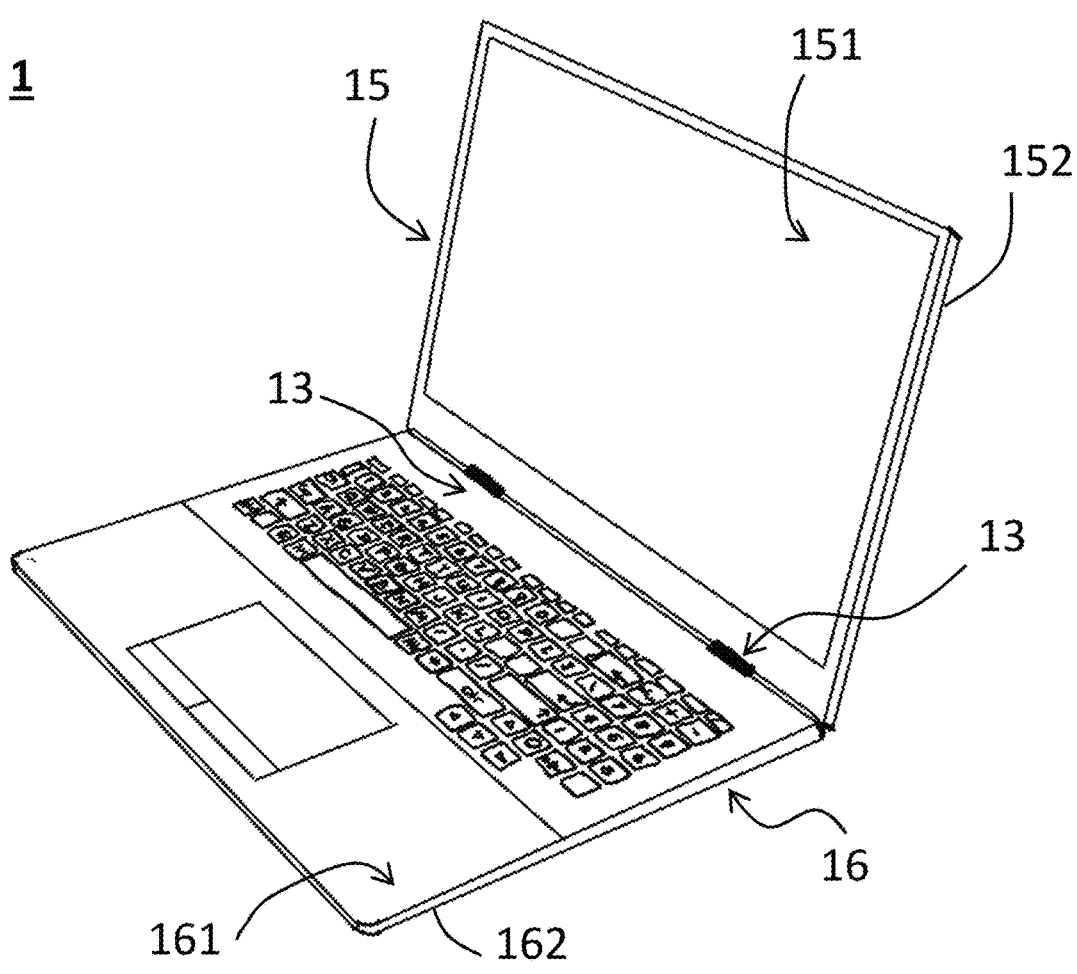
FIG. 2A is an exemplary perspective view showing a notebook computer in a general opened use position according to an embodiment of the invention.
Figure 2B:
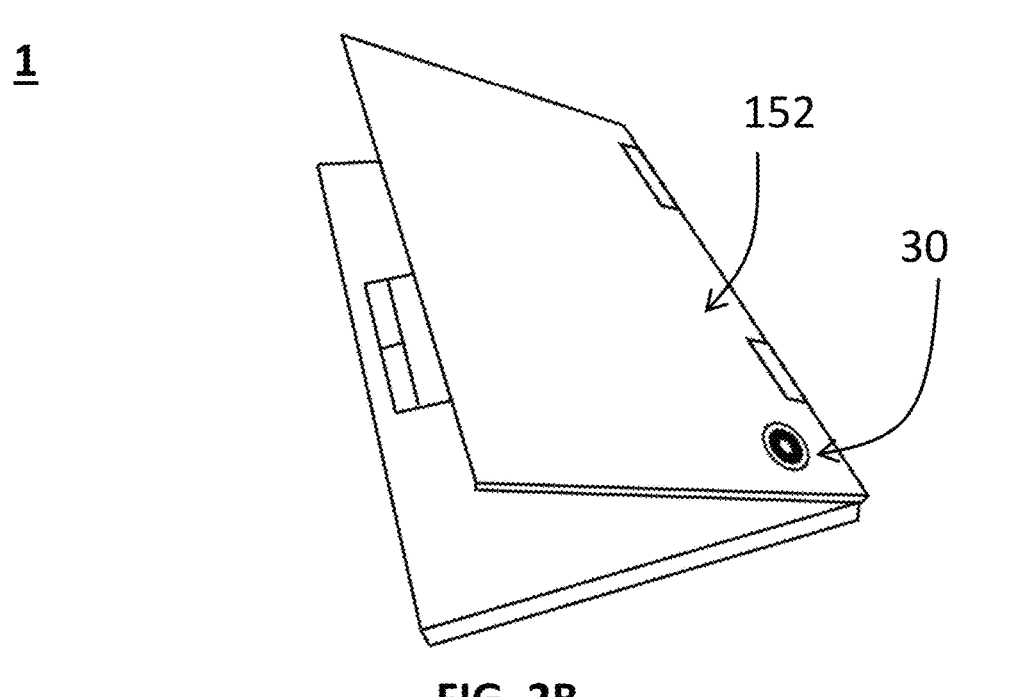
FIG. 2B is an exemplary perspective view showing a notebook computer in a general opened but not use position according to an embodiment of the invention.
Figure 2C:
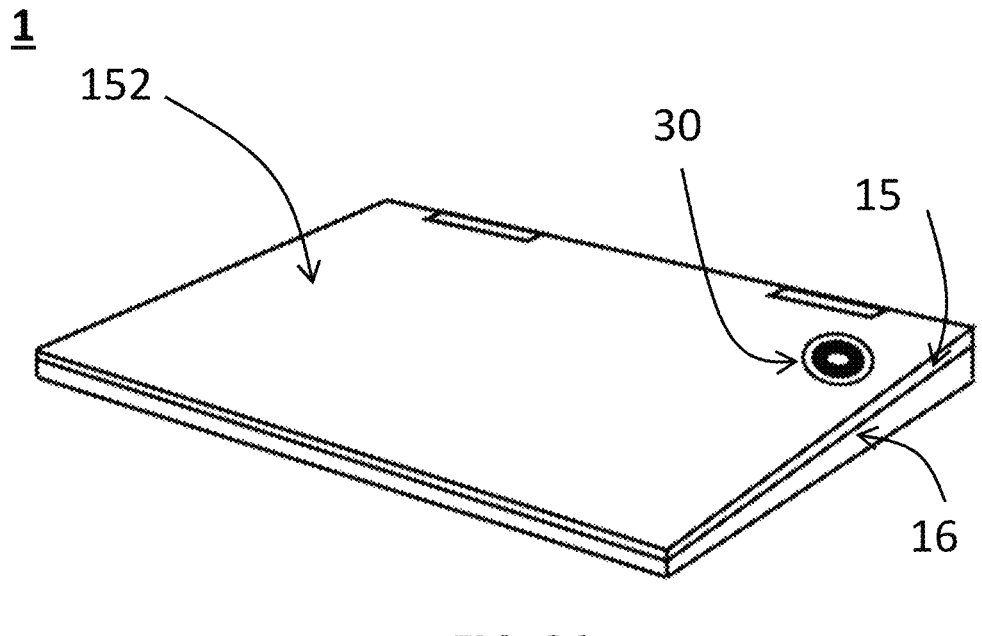
FIG. 2C is an exemplary perspective view showing a notebook computer in a closed position according to an embodiment of the invention.
Figure 2D:
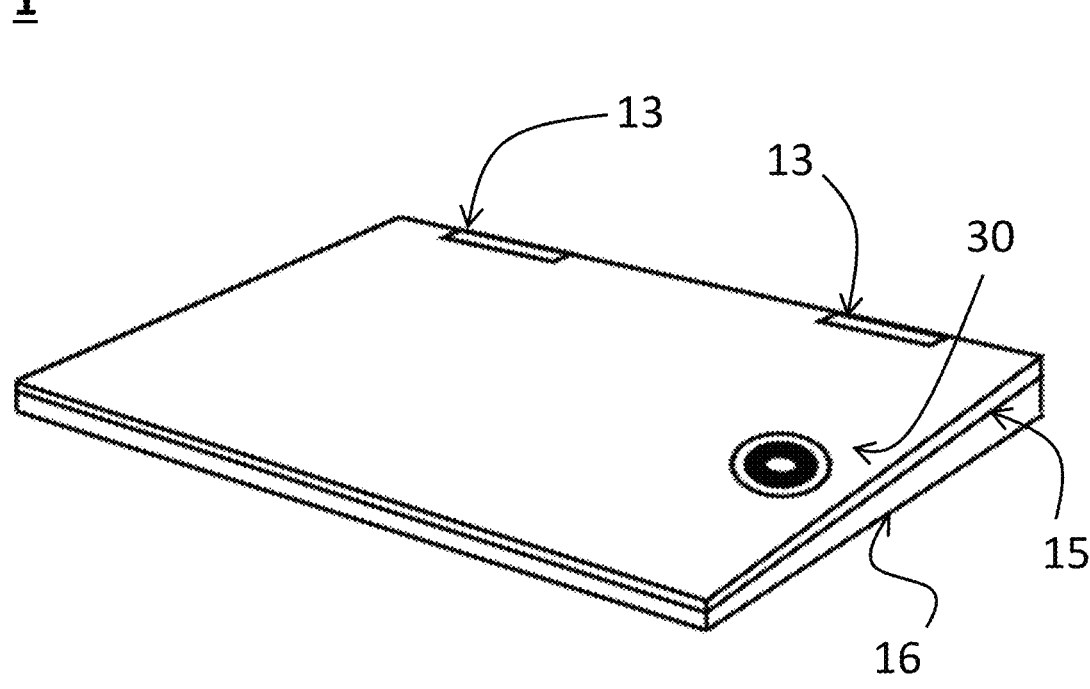
FIG. 2D is another exemplary perspective view showing a notebook computer in a closed position according to an embodiment of the invention.

FIG. 2A shows the perspective view of the notebook computer in an opened use position, FIG. 2B shows the perspective view of the notebook computer in a half open position, and FIGS. 2C-2D shows the perspective view of the notebook computer in a closed position. The power supply switch module 30 is disposed in the lid module 15 through its back cover 152. This switch can be used when the notebook computer is in closed position.

Figure 3A:
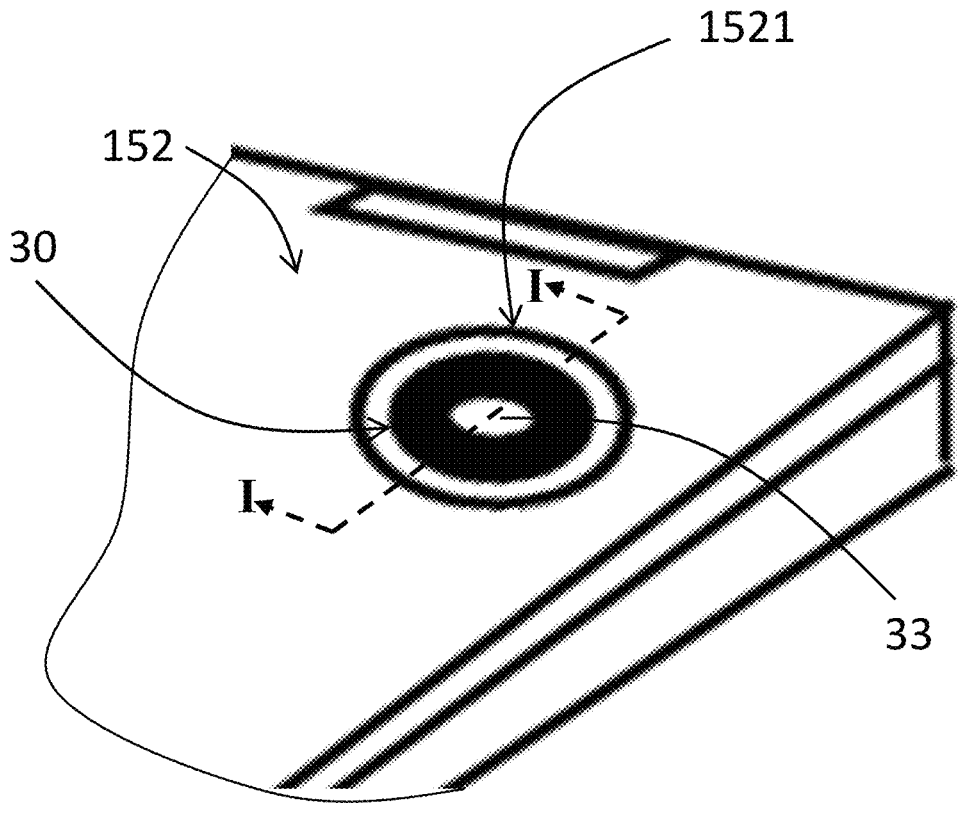
FIG. 3A is a partial, local perspective view of a power switch module disposed on the back cover of the lid module of a notebook computer in greater detail according to an embodiment of the invention.

FIG. 3A is a partial, perspective view of an embodiment of the notebook computer of this invention, the notebook computer including an embodiment of a power switch module 30 installed through an assembly hole 1521 made on the lid back cover 152. The button 33 of power switch module 30 is exposed through the hole 1521 and is the interface for the user to press and to control the power states of the notebook computer.

Figure 3B:
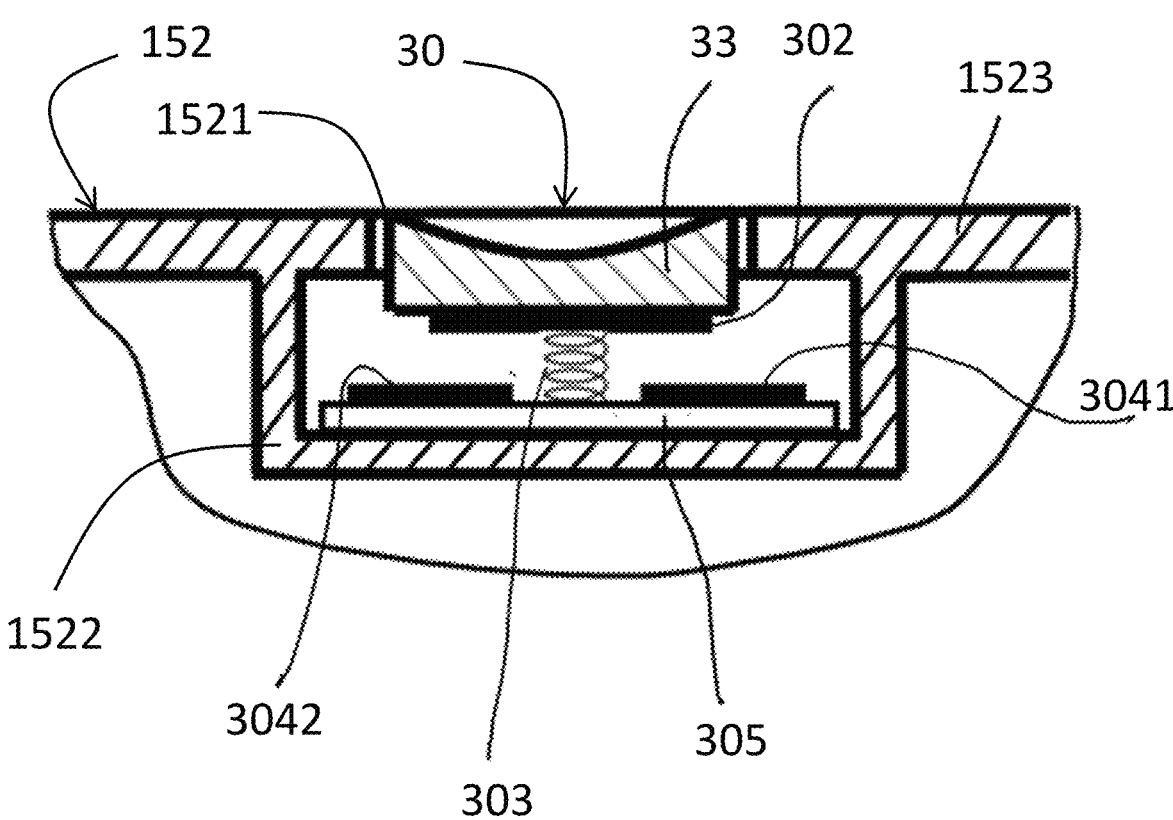
FIG. 3B is an exploded, exemplary cross-section view of a power switch module in its assembled configuration on the lid module of a notebook computer according to an embodiment of the invention.

FIG. 3B is an enlarged view of cross-section I-I of FIG. 3A and shows the detailed assembly and construction of the power switch of an embodiment. The power switch module 30 includes a user touch button 33, a conductive layer 302 attached to the bottom of the button 33, a coil type spring 303, a printed circuit board (PCB) 305 with two conductive traces 3041 and 3042 placed on top of it oriented toward the conductive layer 302. These two traces are connected to the power control circuitry placed in the main body base 16 (the connection and the circuitry is not shown here). The two ends of spring 303 are attached to the button 33 and PCB 305 respectively, assembling them together. When the button 33 is not pressed, the spring 303 is in its resting position, creates a gap between conductive layer 302 and conductive traces 3041 and 3042, and keeps the circuit open. When the button 33 is depressed, the spring 303 contracts such that the conductive material 302 moves downwards and electrically connects the first conductive trace 3401 and second conductive trace 3402, generating an electrical signal to the main body base 16 and triggering various types of power related actions such as turning the notebook computer on, off, or activating hibernation or sleep states. When the button 33 is released, the spring elastically recovers to its resting position, and the circuit connected through the conductive traces 3041 and 3042 is open again. Lid 152 has a hole 1521, an attached frame 1522 where the power switch module 30 is attached to, and a solid formed sheet structure 1523 with certain thickness to provide stiffness to hold the display screen 151 and the power switch module 30.

Figure 4:
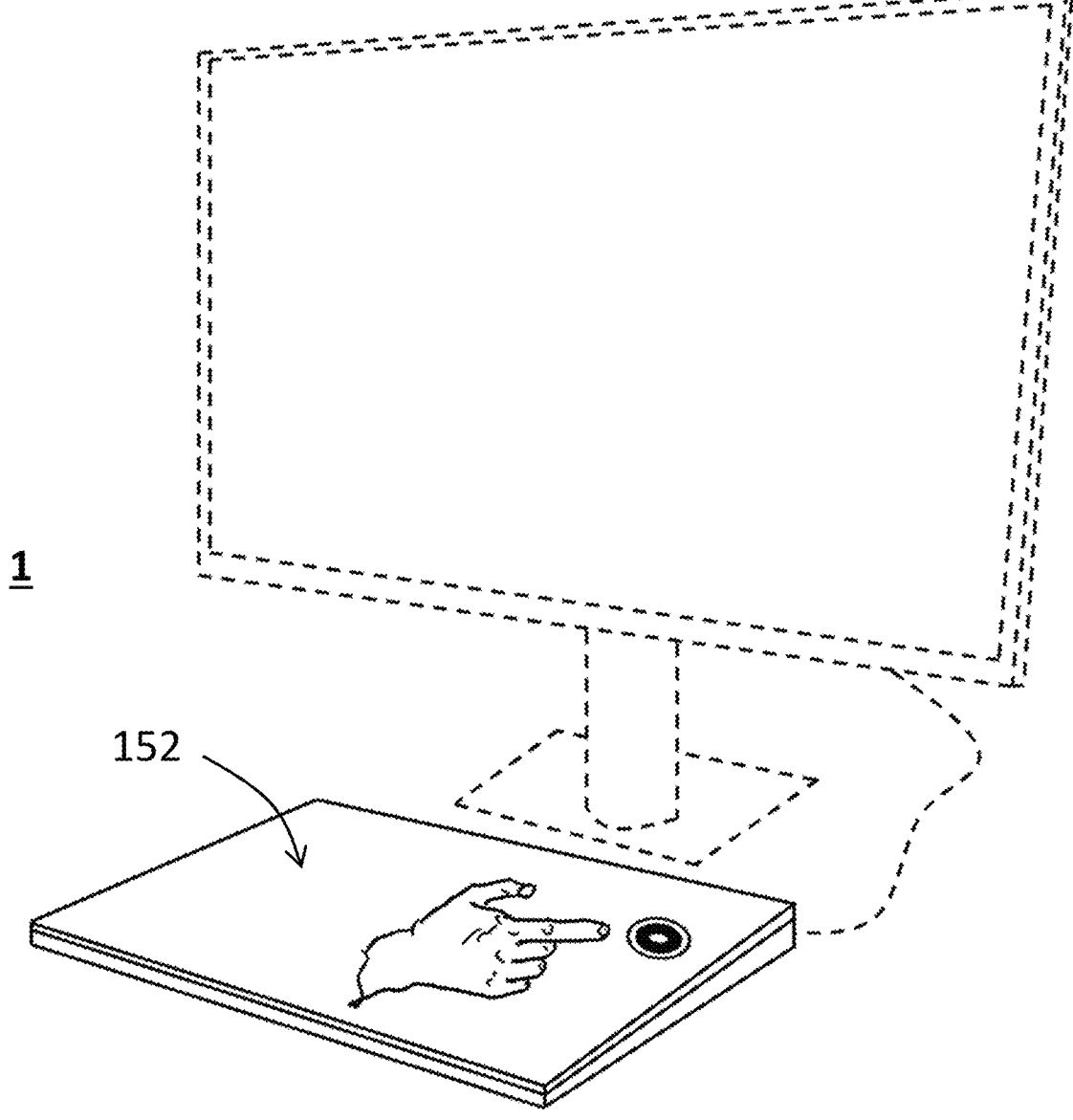
FIG. 4 is illustration of an exemplary implementation that is operable to employ the notebook computer of the invention.

FIG. 4 illustrates a scenario in which a notebook computer is in its closed position and is connected to an external monitor. With an embodiment of this invention, the user can press the power button of the power switch module without the need to open the lid.

Second Embodiment

Figure 5:
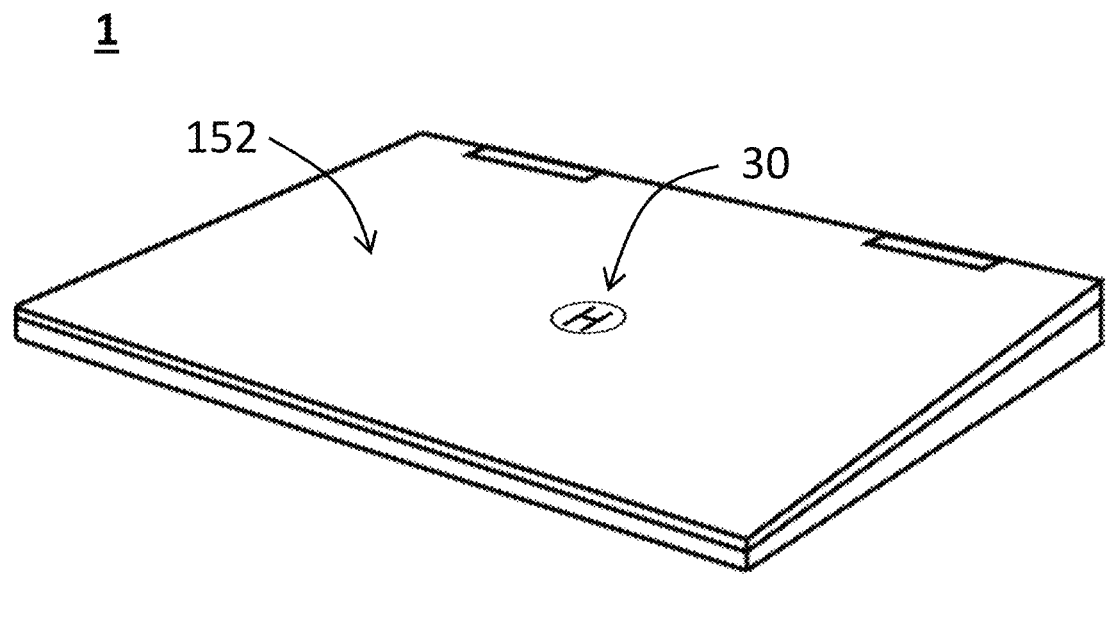
FIG. 5 is a perspective view of another embodiment of the invention where the power supply switch carries the logo of the notebook computer manufacturer.

Refer to FIG. 5, to make the power switch module 30 more appealing, the button 33 is made in the form of a customized pattern. The pattern can be a company logo, a user's initial, etc., with or without color light illumination.

Third Embodiment

Figure 6:
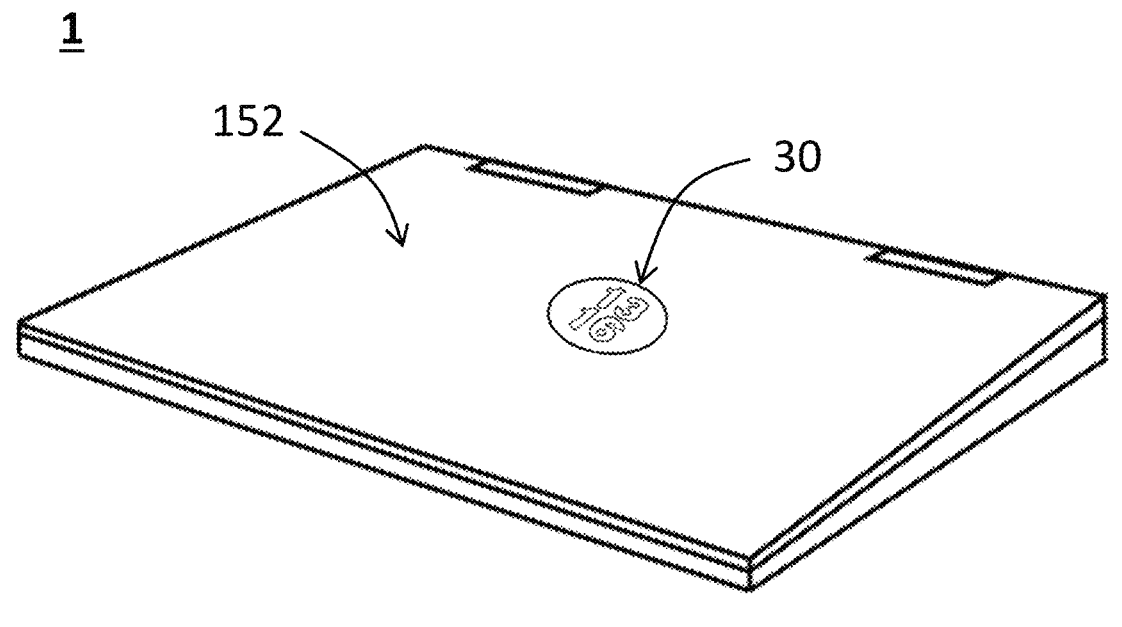
FIG. 6 is a perspective view of yet another embodiment of the invention where the power supply switch has a small display that shows simple customized contents per the user's choice.

Refer to FIG. 6, to make the power switch module 30 more practical, the button 33 is made in the form of a small display screen in the size of a digital watch or a diameter of 40 mm to 50 mm, displaying customized information according to the user's preference.

Fourth Embodiment

Figure 7:
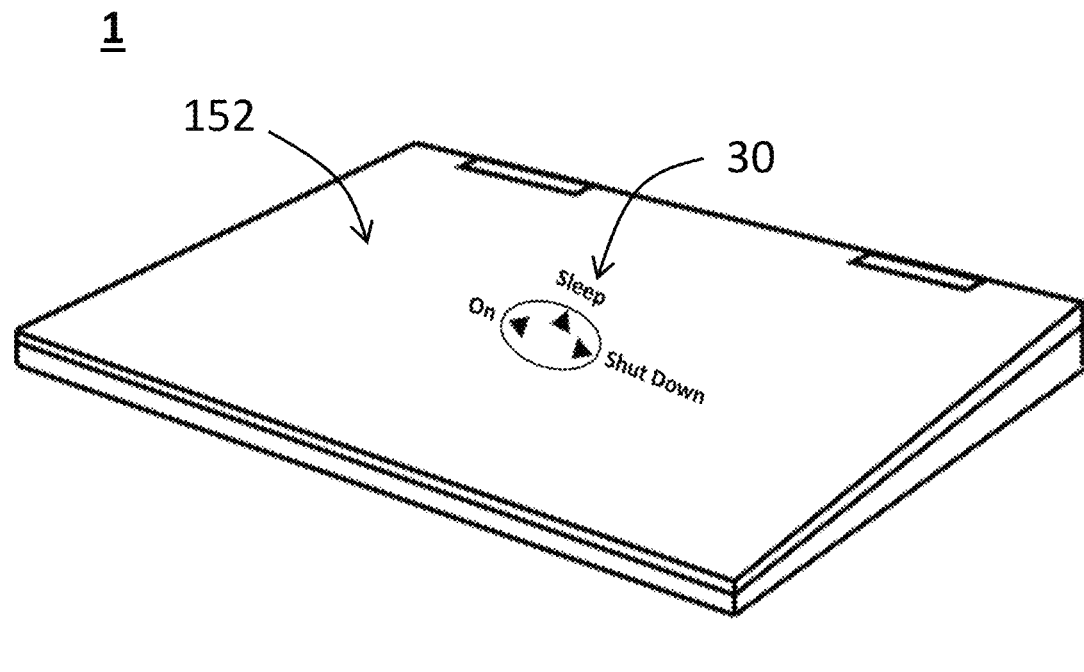
FIG. 7 is a perspective view of yet another embodiment of the invention where the power supply switch is designed with a touch pad having actions clearly labeled.

Refer to FIG. 7, to make the power switch module 30 more intuitive, the button 33 is made in the form of a touch pad, with functions clearly labeled.

Fifth Embodiment

Figure 8:
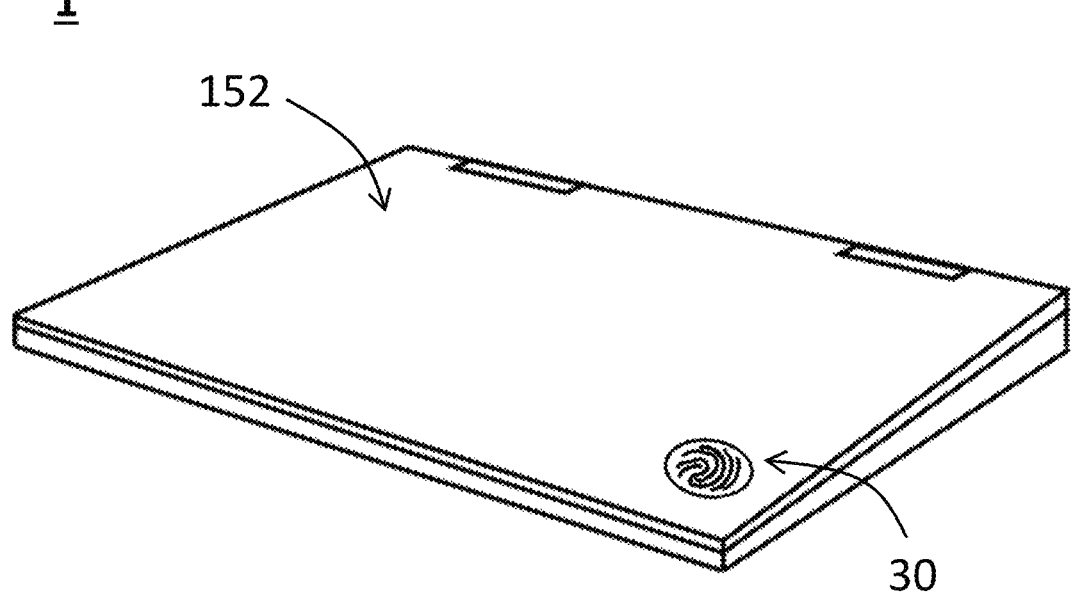
FIG. 8 is a perspective view of yet another embodiment of the invention where the power supply switch is in combination with a fingerprint sensor module.

Refer to FIG. 8, to add more function to the power switch module 30, a combo module that functions as both a power switch and a fingerprint sensor can be made, where the button 33 is the touch surface of a fingerprint sensor, providing security to access the notebook computer.

Sixth Embodiment

Figure 9:
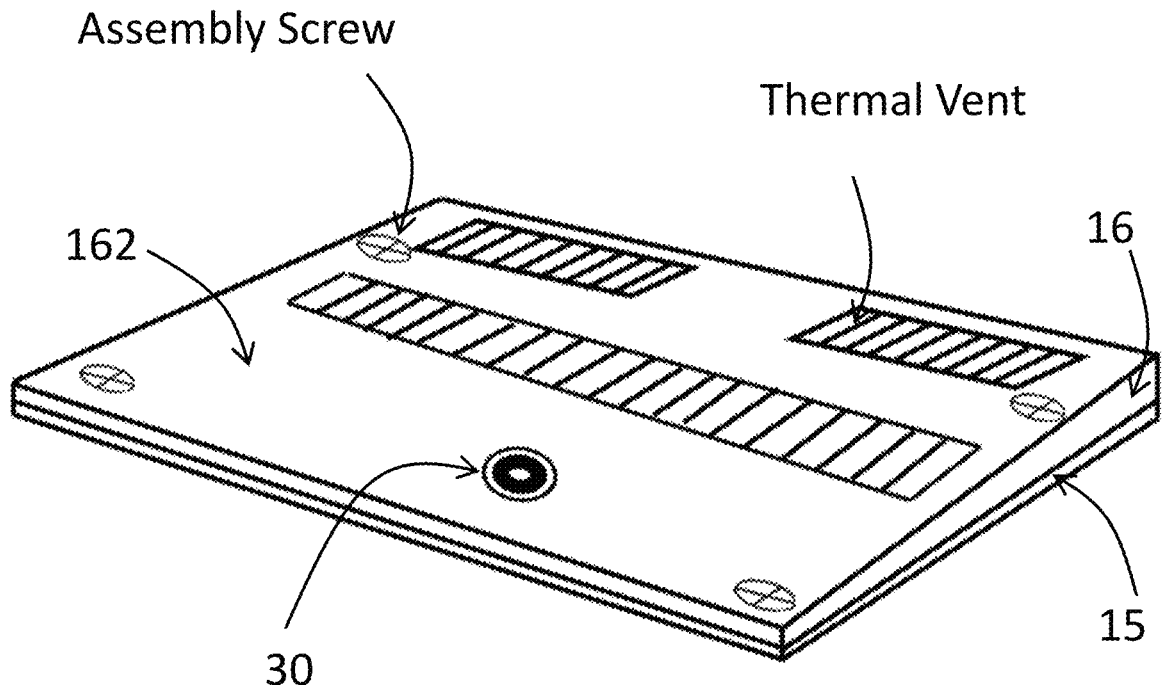
FIG. 9 is an exemplary perspective view showing a notebook computer in a closed position, and it is placed upside down with the second surface of the main body base at top and the lid module at bottom according to an embodiment of the invention.

Refer to FIG. 9, the power switch module 30 is assembled on the back cover surface 162 of the main body base 16. Under certain circumstances, it is preferable to place the notebook computer upside down from its normal position such that the external surface 162 faces upward and lid back cover 152 sits on a supporting surface. The benefit to place the notebook computer in this way is that the thermal vents are facing up for better air circulation, improving the convective heat transfer coefficient. The switch can be used when the notebook computer is in such a closed position.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A notebook computer, comprising:
a main body base to house a plurality of internal components including power control circuitry for controlling a power state of the notebook computer, wherein the main body base includes a first surface to which a keyboard and touch pad are attached, and a second surface that is opposite to the first surface and functions as a back cover of the main body base;
a lid module attached to a back portion of the main body base via a connecting part that enables pivoting of the lid module between an open position or a closed position relative to the main body base, where the lid module includes:
a display screen that is viewable to a user when in the open position and faces the first surface of the main body base when in the closed position,
a back cover on a surface opposite the display screen that houses and protects the display screen in the closed position, wherein the back cover includes a hole and an attached frame around the hole that is internal to the back cover;
a power switch module comprising:
a button having an exposed user interface comprising a surface externally accessible on the back cover of the lid module when the notebook computer is in the closed position,
a conductive layer attached to a bottom of the button;
a printed circuit board supported by the attached frame internal to the back cover, the printed circuit board having conductive traces that are electrically connected by the conductive layer on the bottom of the button when the button is pressed, and are electrically decoupled when the button is not pressed,
wherein the conductive traces on the printed circuit board conduct an electrical signal to the power control circuitry in the main body base to control turning on the notebook computer and turning off the notebook computer,
wherein the power switch module is positioned within the hole of the lid module and the power switch module is internally supported by the attached frame of the back cover; and
a solid formed sheet structure to hold the display screen and the power switch module.

2. The notebook computer according to claim 1, wherein the exposed user interface of the power switch module comprises a solid button.

3. The notebook computer according to claim 1, wherein the exposed user interface of the power switch module shows a form of a business logo.

4. The notebook computer according to claim 3, wherein the business logo emits at least one color of light or a combination of several colors of light.

5. The notebook computer according to claim 1, wherein the exposed user interface of the power switch module comprises a digital display that shows programmable contents.

6. The notebook computer according to claim 1, wherein the exposed user interface of the power switch module comprises a touch button with at least one labeled function.

7. The notebook computer according to claim 1, wherein the exposed user interface of the power switch module comprises a fingerprint sensor.

8. The notebook computer according to claim 1, wherein the power switch module further controls activating a hibernation state of the notebook computer.

9. The notebook computer according to claim 1, wherein the power switch module further controls activating a sleep state of the notebook computer.

10. The notebook computer of claim 1, wherein the power switch module further comprises:
a spring positioned between the bottom of the button and the printed circuit board, wherein the spring contracts when the button is depressed to enable the conductive layer to electrically connect with the conductive traces on the printed circuit, and the spring elastically recovers to a resting position when not depressed such that a gap is created between the conductive traces on the printed circuit board and the conductive layer on the bottom of the button.

11. The notebook computer of claim 1, wherein the main body base includes at least one of: a keyboard and a touch pad.

12. A notebook computer, comprising:
a main body base to house a plurality of internal components including power control circuitry for controlling a power state of the notebook computer, wherein the main body base includes a first surface to which a keyboard and touch pad are attached, and a second surface that is opposite to the first surface and functions as a bottom cover of the main body base;
a lid module attached to a back portion of the main body base via a connecting part that enables pivoting of the lid module between an open position or a closed position relative to the main body base, where the lid module includes a display screen that is viewable to a user when in the open position and faces the first surface of the main body base when in the closed position, and a back cover on a surface opposite the display screen that houses and protects the display screen in the closed position; and
a power switch module integrated with the main body base, wherein the power switch module comprises:
a button having an exposed user interface comprising a surface externally accessible on the bottom cover of the main body base;
a conductive layer attached to the button;
a printed circuit board with conductive traces that are electrically connected by the conductive layer of the button when the button is pressed, and are electrically decoupled when the button is not pressed,
wherein the conductive traces on the printed circuit board conduct an electrical signal to the power control circuitry in the main body base to control turning on the notebook computer and turning off the notebook computer,
wherein the power switch module is positioned within a hole of the bottom cover and the power switch module is internally supported by a frame attached to the bottom cover of the main body base.

13. The notebook computer of claim 12, wherein the bottom cover through which the button of the power module is accessible includes thermal vents.

14. The notebook computer of claim 12, wherein the power switch module further comprises:

a spring positioned between the bottom of the button and the printed circuit board, wherein the spring contracts when the button is depressed to enable the conductive layer to electrically connect with the conductive traces on the printed circuit, and the spring elastically recovers to a resting position when not depressed such that a gap is created between the conductive traces on the printed circuit board and the conductive layer on the bottom of the button.

15. The notebook computer of claim 1, wherein the main body base includes at least one of: a keyboard and a touch pad that are accessible on a surface opposite the bottom cover when in the open position.

\* \* \* \* \*